(12) United States Patent
Inukai

(10) Patent No.: US 9,939,470 B2
(45) Date of Patent: Apr. 10, 2018

(54) ANALOGUE MEASUREMENT DATA DETECTION SYSTEM AND BATTERY VOLTAGE DETECTION SYSTEM

(71) Applicant: PANASONIC INTELLECTUAL PROPERTY MANAGEMENT CO., LTD., Osaka (JP)

(72) Inventor: Fumihito Inukai, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 46 days.

(21) Appl. No.: 15/074,381

(22) Filed: Mar. 18, 2016

(65) Prior Publication Data

US 2016/0258987 A1 Sep. 8, 2016

Related U.S. Application Data

(60) Division of application No. 14/142,634, filed on Dec. 27, 2013, now Pat. No. 9,322,882, which is a continuation of application No. PCT/JP2012/001627, filed on Mar. 9, 2012.

(30) Foreign Application Priority Data

Jun. 30, 2011 (JP) .................................. 2011-146659

(51) Int. Cl.
| | | |
|---|---|---|
| *H02J 7/00* | (2006.01) | |
| *G01R 19/257* | (2006.01) | |
| *G01R 31/36* | (2006.01) | |
| *H03K 5/24* | (2006.01) | |
| *B60L 11/18* | (2006.01) | |
| *G01R 19/165* | (2006.01) | |

(52) U.S. Cl.
CPC ........ *G01R 19/257* (2013.01); *B60L 11/1861* (2013.01); *G01R 31/362* (2013.01); *G01R 31/3606* (2013.01); *H03K 5/24* (2013.01); *G01R 19/16542* (2013.01); *G01R 31/3658* (2013.01)

(58) Field of Classification Search
CPC ........ G01R 19/252; G01R 19/18; H03K 7/06; H03M 1/00; H03M 2201/4135

USPC .......................................................... 324/120
See application file for complete search history.

(56) References Cited

U.S. PATENT DOCUMENTS

| 4,554,639 A | 11/1985 | Baker et al. |
| 2002/0149357 A1 | 10/2002 | Morimoto et al. |
| 2007/0216370 A1* | 9/2007 | Zhou .................... H02J 7/06 320/141 |
| 2009/0033292 A1 | 2/2009 | Majima |
| 2011/0068854 A1 | 3/2011 | Engl |
| 2012/0007652 A1 | 1/2012 | Li |

FOREIGN PATENT DOCUMENTS

| JP | 61-199199 A | 9/1986 |
| JP | 04-323568 A | 11/1992 |
| JP | 06-059751 A | 3/1994 |
| JP | 11-332111 A | 11/1999 |
| JP | 2010-060435 A | 3/2010 |

OTHER PUBLICATIONS

International Search Report issued in PCT/JP2012/001627, dated Jun. 5, 2012, with English translation.
Non-Final Office issued in related U.S. Appl. No. 14/142,634, dated Sep. 29, 2015.

* cited by examiner

*Primary Examiner* — Arun Williams
(74) *Attorney, Agent, or Firm* — McDermott Will & Emery LLP

(57) ABSTRACT

An analog measurement data detection system according to the present invention includes: a reference voltage generation circuit configured to generate and output a reference voltage; an analog/digital converter configured to compare an analog signal with the reference voltage outputted from the reference voltage generation circuit, and based on a differential voltage between the analog signal and the reference voltage, generate and output a digital signal corresponding to the analog signal. The reference voltage generation circuit is configured to cause the reference voltage to have such a temperature characteristic as to compensate for temperature characteristics of at least the analog/digital converter and the reference voltage generation circuit.

17 Claims, 8 Drawing Sheets

ANALOGUE MEASUREMENT DATA DETECTION SYSTEM AND BATTERY VOLTAGE DETECTION SYSTEM

This application is a Divisional of U.S. application Ser. No. 14/142,634, filed Dec. 27, 2013, now U.S. Pat. No. 9,322,882, issued on Apr. 26, 2016, which is a Continuation application of International Application No. PCT/JP2012/001627, filed on Mar. 9, 2012, which claims the benefit of priority of Japanese Application No. 2011-146659, filed Jun. 30, 2011, the contents of which are incorporated herein by reference.

BACKGROUND OF THE INVENTION

1. Field of the Invention

The present invention relates to an analogue measurement data detection system and particularly to a battery voltage detection system configured to detect voltages of in-vehicle lithium ion batteries.

2. Description of the Related Art

One of the measures for assuring, the safety of a battery module in which a plurality of battery cells are connected in series is to manage the voltage of each of the plurality of battery cells (hereinafter, referred to as a cell voltage). One specific example is to perform charge-discharge control based on a measured value of each cell voltage. Among various secondary batteries, lithium ion batteries in particular are mainly used as batteries to be installed in hybrid electric vehicles (HEV) and electric vehicles (EV) for the reason that lithium ion batteries have a higher output voltage, higher energy density, and higher efficiency than other secondary batteries. However, it is difficult to control charging and discharging of lithium ion batteries, and lithium ion batteries are known to have a risk of explosion and firing. Therefore, in a case where a regarding charge-discharge control is essential.

For example, Japanese Laid-Open Patent Application Publication No. 2010-60435 proposes a battery voltage detection system configured to detect battery cell voltages with high precision. FIG. 8 shows a configuration of the battery voltage detection system disclosed in Japanese Laid-Open Patent Application Publication No. 2010-60435. In the battery voltage detection system shown in FIG. 8, battery cells CEL1 to CELn are connected in series. Voltages at terminals of the battery cells CEL1 to CELn are supplied to respective voltage input nodes NC0 to NCn. Switches SA0 to SAn and SB0 to SBn of a switching unit 10 turn ON or OFF connections between the voltage input nodes NC0 to NCn and detection input nodes NA and NB based on control by a controller 50. A voltage detector 20 is configured to generate a voltage detection signal S20 in accordance with a difference between voltages inputted to the respective detection input nodes NA and NB. An analogue/digital converter 30 is configured to convert the voltage detection signal S20 outputted from the voltage detector 20, into digital data with a predetermined bit length. A detection data processor 40 is configured to generate voltage detection data S40, which indicates a precise voltage of each of the battery cells CEL1 to CELn, based on digital data S30 outputted from the analogue/digital converter 30. The controller 50 is configured to control the switching unit 10 to detect the voltage of each of the battery cells CEL1 to CELn by means of the voltage detector 20. Specifically, the controller 50 is configured to sequentially select one of the battery cells CEL1 to CELn, and connect a pair of voltage input nodes connected to positive and negative electrodes of the selected battery cell to the detection input nodes NA and NB in two patterns (forward connection and reverse connection).

SUMMARY OF THE INVENTION

Problems as described below occur in such a battery voltage detection system as shown in FIG. 8, which is an analogue measurement data detection system configured to convert an analogue measurement signal into a digital measurement signal by using an analogue/digital converter and output the converted signal to, for example, an external system controller.

Generally speaking, an analogue/digital converter is configured to compare an input analogue voltage with a reference voltage supplied from a band gap reference (hereinafter, BGR), and convert the analogue voltage into a digital signal based on a differential voltage between the analogue voltage and the reference voltage. It should be noted that the reference voltage supplied from the BGR to the analogue/digital converter is not constant but has such a temperature characteristic that the reference voltage varies in accordance with a temperature. Accordingly, a digital measurement signal outputted from such an analogue/digital converter varies in accordance with the variation in the reference voltage.

One conceivable measure to prevent the above problem is to perform a correction process on the BGR such that the temperature characteristic of the reference voltage outputted from the BGR becomes substantially constant, thereby stabilizing the digital measurement signal outputted from the analogue/digital converter. However, the above measure is insufficient, because when looking at the entire analogue measurement data detection system, there is not only the temperature characteristic of the reference voltage outputted from the BGR but also temperature characteristics of the analogue/digital converter and other preceding circuits (e.g., an amplifier).

The present invention has been made to solve the above problems. An object of the present invention is to provide an analogue measurement data detection system that is continued to stabilize the temperature characteristic of a digital measurement signal outputted from an analogue/digital converter, thereby improving the precision of analogue/digital conversion.

In order to solve the above-described problems, an analogue measurement data detection system according to one aspect of the present invention includes: a reference voltage generation circuit configured to generate and output a reference voltage; and an analogue/digital converter configured to compare an analogue signal with the reference voltage outputted from the reference voltage generation circuit, and based on a differential voltage between the analogue signal and the reference voltage, generate and output a digital signal corresponding to the analogue signal. The reference voltage generation circuit is configured to cause the reference voltage to have such a temperature characteristic as to compensate for temperature characteristics of at least the analogue/digital converter and the reference voltage generation circuit.

The above configuration makes it possible to provide an analogue measurement data detection system that is configured to stabilize the temperature characteristic of the digital signal outputted from the analogue/digital converter by causing the reference voltage used in the analogue/digital converter to have such a temperature characteristic as to compensate for the temperature characteristics of at least the analogue/digital converter and the reference voltage generation circuit, thereby improving the precision of analogue/digital conversion.

An analogue measurement data detection system according to another aspect of the present invention includes: an amplifier configured to amplify an analogue measurement signal inputted from an analogue measurement subject, and output the amplified signal; a reference voltage generation circuit configured to generate and output a reference voltage; and an analogue/digital converter configured to compare the analogue measurement signal outputted from the amplifier with the reference voltage outputted from the reference voltage generation circuit, and based on a differential voltage between the analogue measurement signal and the reference voltage, generate and output a digital measurement signal corresponding to the analogue measurement signal. The reference voltage generation circuit is configured to cause the reference voltage to have such a temperature characteristic as to compensate for all of temperature characteristics of at least the amplifier, the analogue/digital converter, and the reference voltage generation circuit.

The above configuration makes it possible to provide an analogue measurement data detection system that is configured to stabilize the temperature characteristic of the digital measurement signal outputted from the analogue/digital converter by causing the reference voltage used in the analogue/digital converter to have such a temperature characteristic as to compensate for all of the temperature characteristics of at least the amplifier, the analogue/digital converter, and the reference voltage generation circuit, thereby improving the precision of analogue/digital conversion.

In the above analogue measurement data detection system, the reference voltage generation circuit may include two resistors, and the reference voltage generation circuit may be configured to cause the reference voltage to have the temperature characteristic by adjusting a ratio between the two resistors.

In the above analogue measurement data detection system, the reference voltage generation circuit may include: a differential amplifier; a first resistor connected between an output terminal and a non-inverting input terminal of the differential amplifier; a first diode circuit element connected between a ground, and the non-inverting input terminal of the differential amplifier and one end of the first resistor; a second resistor connected between the output terminal and an inverting input terminal of the differential amplifier; a third resistor whose one end is connected to the inverting input terminal of the differential amplifier and one end of the second resistor; and a second diode circuit element connected between the other end of the third resistor and the ground. A resistance ratio between the second resistor and the third resistor may be adjustable.

According to the above configuration, by merely adjusting the resistance ratio between the second resistor and the third resistor, the reference voltage used in the analogue/digital converter can be caused to have such a temperature characteristic as to compensate for all of the temperature characteristics of at least the amplifier, the analogue/digital converter, and the reference voltage generation circuit.

A battery voltage detection system according to yet another aspect of the present invention includes: a selector configured such that terminal voltages of a plurality of battery cells connected in series in a battery are inputted to the selector, the selector multiplexing the terminal voltages based on a selector signal and outputting a resultant analogue signal; a reference voltage generation circuit configured to generate and output a reference voltage; an analogue/digital converter configured to compare the analogue signal outputted from the selector with the reference voltage outputted from the reference voltage generation circuit, and based on a differential voltage between the analogue signal and the reference voltage, generate and output a digital signal corresponding to the analogue signal; and a digital processor configured to convert an output from the analogue/digital converter into digital values corresponding to cell voltages of the plurality of respective battery cells. The reference voltage generation circuit is configured to cause the reference voltage to have such a temperature characteristic as to compensate for all of temperature characteristics of at least the selector, the analogue/digital converter, and the reference voltage generation circuit.

The above configuration makes it possible to provide a battery voltage detection system that is configured to stabilize the temperature characteristic of the digital signal outputted from the analogue/digital converter by causing the reference voltage used in the analogue/digital converter to have such a temperature characteristic as to compensate for all of the temperature characteristics of at least the selector, the analogue/digital converter, and the reference voltage generation circuit, thereby improving the precision of analogue/digital conversion.

A battery voltage detection system according to yet another aspect of the present invention includes: a selector configured such that terminal voltages of a plurality of battery cells connected in series in a battery are inputted to the selector, the selector multiplexing the terminal voltages based on a selector signal; an amplifier configured to amplify an output from the selector, and output a resultant analogue measurement signal; a reference voltage generation circuit configured to generate and output a reference voltage; an analogue/digital converter configured to compare the analogue measurement signal outputted from the amplifier with the reference voltage outputted from the reference voltage generation circuit, and based on a differential voltage between the analogue measurement signal and the reference voltage, generate and output a digital measurement signal corresponding to the analogue measurement signal; a digital processor configured to convert an output from the analogue/digital converter into digital values corresponding to cell voltages of the plurality of respective battery cells. The reference voltage generation circuit is configured to cause the reference voltage to have such a temperature characteristic as to compensate for all of temperature characteristics of at least the selector, the amplifier, the analogue/digital converter, and the reference voltage generation circuit.

The above configuration makes it possible to provide a battery voltage detection system that is configured to stabilize the temperature characteristic of the digital measurement signal outputted from the analogue/digital converter by causing the reference voltage used in the analogue/digital converter to have such a temperature characteristic as to compensate for all of the temperature characteristics of at least the selector, the amplifier, the analogue/digital converter, and the reference voltage generation circuit, thereby improving the precision of analogue/digital conversion.

In the above battery voltage detection system, the digital processor may be configured to perform offset correction and gain correction on the output from the analogue/digital converter.

The above configuration makes it possible to remove influence of, for example, an offset error and gain error of the amplifier and the analogue/digital converter in addition to correcting the temperature characteristic of the digital measurement signal outputted from the analogue/digital converter.

Advantageous Effects of the Invention

The present invention makes it possible to provide an analogue measurement data detection system, in particular a battery voltage detection system, configured to stabilize the temperature characteristic of a digital measurement signal outputted from an analogue/digital converter, thereby improving the precision of analogue/digital conversion.

DESCRIPTION OF THE PREFERRED EMBODIMENTS

Figure 1:
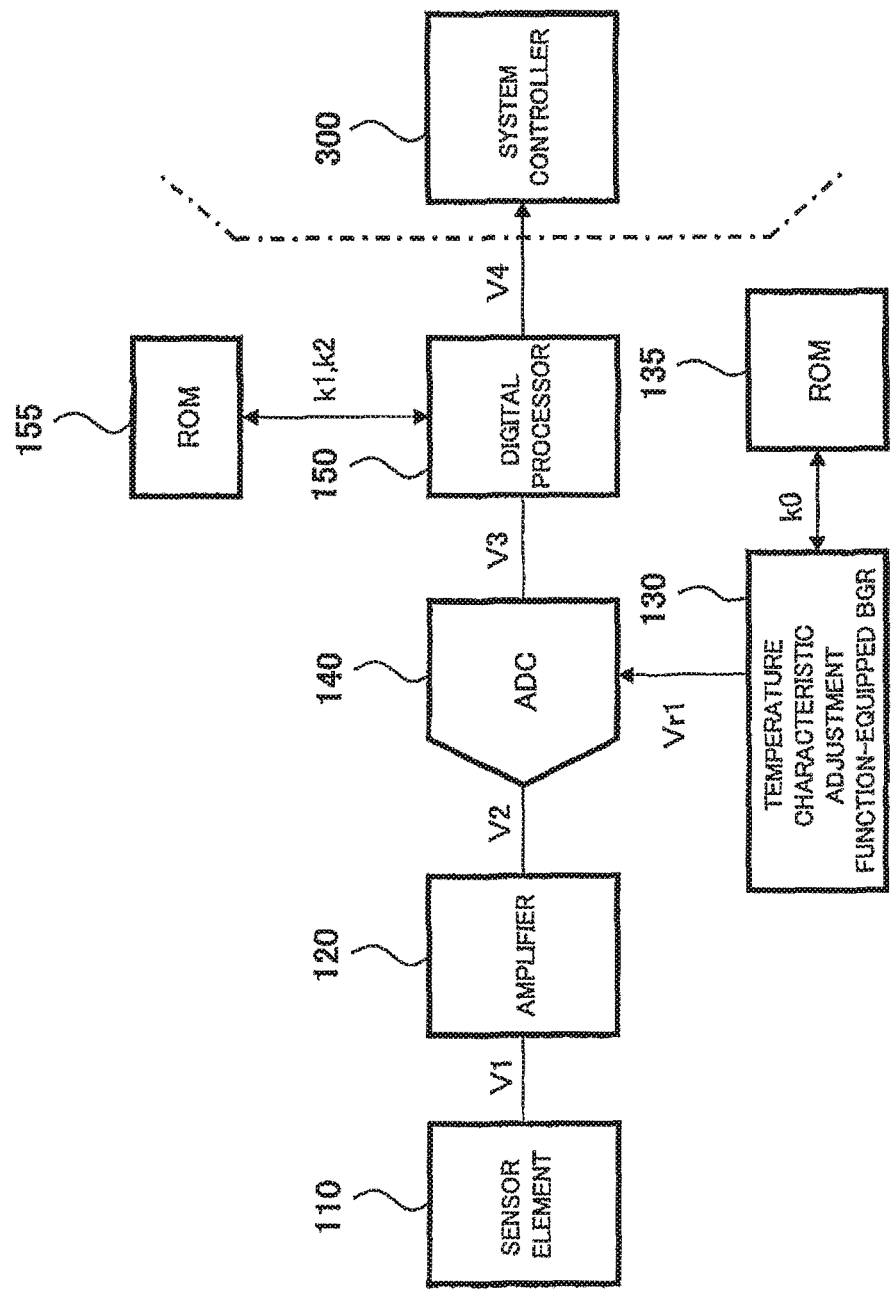
FIG. 1 shows an example of the configuration of an analogue measurement data detection system according to Embodiment 1 of the present invention.

Hereinafter, preferred embodiments of the present invention are described with reference to the drawings. In the drawings, the same or corresponding elements are denoted by the same reference signs, and repeating the same descriptions is avoided below.

Embodiment 1

Configuration Example

Hereinafter, Embodiment 1 of the present invention is described with reference to FIG. 1. FIG. 1 shows an example of the configuration of an analogue measurement data detection system according to Embodiment 1 of the present invention.

The analogue measurement data detection system shown in FIG. 1 includes: a sensor element 110; an amplifier 120; a temperature characteristic adjustment function-equipped BGR (Band Gap Reference) 130; a ROM 135; an analogue/digital converter 140; a digital processor 150; and a ROM 155.

The sensor element 110 is an element for use in detecting analogue measurement data (voltage, current, temperature, pressure, flow rate, or the like) from an intended analogue measurement subject. It should be noted that the analogue measurement data detected by the sensor element 110 is converted into an electrical signal, and the electrical signal is inputted to the amplifier 120 as an analogue measurement signal V1.

The amplifier 120 is an amplifier configured to perform analogue input and analogue output. The amplifier 120 amplifies the analogue measurement signal V1 sent from the sensor element 110, and outputs the amplified signal as an analogue measurement signal V2. It should be noted that the analogue measurement signal V2 is inputted to the analogue/digital converter 140. The amplifier 120 may be an analogue amplifier configured as a differential amplifier, or may be, for example, a digital amplifier configured to convert an analogue input into a pulse signal, amplify the pulse signal by digital signal processing, and outputs the amplified pulse signal as an analogue output via a low-pass filter.

The temperature characteristic adjustment function-equipped BGR 130 is configured as a BGR capable of adjusting the temperature characteristic of a reference voltage Vr1 which is an output voltage from the BGR 130. The ROM 135 stores correction values taking account of not only the temperature characteristic of the temperature characteristic adjustment function-equipped BGR 130 but also the temperature characteristics of the analogue/digital converter 140, the amplifier 120, and the like. Based on the correction values stored in the ROM 135, the temperature characteristic adjustment function-equipped BGR 130 causes the reference voltage Vr1 to have such a temperature characteristic as to compensate for (negate) the total temperature characteristics of the amplifier 120, the analogue/digital converter 140, the temperature characteristic adjustment function-equipped BGR 130, and the like. This consequently makes it possible to perform correction in accordance with a temperature so that digital measurement signal V3 outputted from the analogue/digital converter 140 will be substantially constant.

The analogue/digital converter 140 is configured to: compare the analogue measurement signal V2 outputted from the amplifier 120 with the reference voltage Vr1 outputted from the temperature characteristic adjustment function-equipped BGR 130; convert a differential voltage between the analogue measurement signal V2 and the reference voltage Vr1 into the digital measurement signal V3; and output the digital measurement signal V3. It should be noted that the digital measurement signal V3 is inputted to the digital processor 150. The analogue/digital converter 140 is not limited to a particular type of AD converter, but may be of a delta-sigma ($\Delta\Sigma$) type or successive approximation register (SAR) type. It should be noted that if the analogue/digital converter 140 is of a $\Delta\Sigma$ type, then it is necessary that a digital filter be provided subsequent to the analogue/digital converter 140. In this case, it is assumed that the digital filter is included in the digital processor 150.

The digital processor 150 is configured to perform, based on correction values k1 and k2 stored in the ROM 155, digital correction on the digital measurement signal V3 outputted from the analogue/digital converter 140 in order to remove influence of, for example, an offset error and gain error of the amplifier 120 and the analogue/digital converter 140. A resultant digital measurement signal V4, which has gone through the digital correction, is inputted to a system controller 300.

In addition to the above components, the analogue measurement data detection system shown in FIG. 1 includes a controller (not shown) configured to control the entire system.

[Temperature Characteristic Adjustment Function-Equipped BGR]

Figure 2:
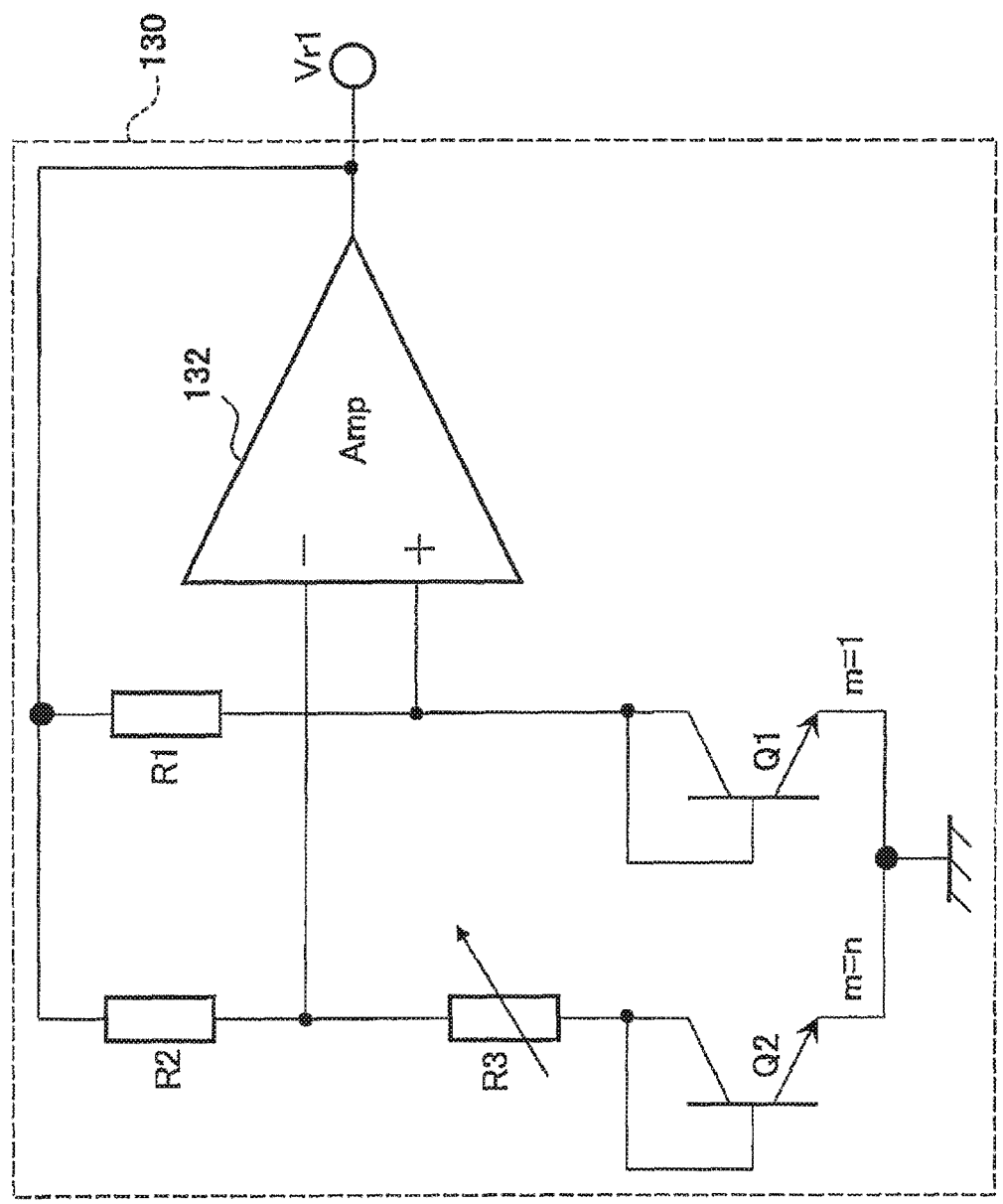
FIG. 2 is a circuit diagram showing an example of the configuration of a temperature characteristic adjustment function-equipped BGR shown in FIG. 1.

FIG. 2 is a circuit diagram showing an example of the configuration of the temperature characteristic adjustment function-equipped BGR 130 shown in FIG. 1.

The temperature characteristic adjustment function-equipped BGR 130 shown in FIG. 2 includes: a differential amplifier 132; a resistor R1 connected between an output terminal and anon-inverting input terminal of the differential amplifier 132; a diode-connected npn transistor Q1 connected between the ground, and the non-inverting input terminal of the differential amplifier 132 and one end of the resistor R1; a resistor R2 connected between the output terminal and an inverting input terminal of the differential amplifier 132; a variable resistor R3 whose one end is connected to the inverting input terminal of the differential amplifier 132 and one end of the resistor R2; and a diode-connected npn transistor Q2 connected between the other end of the variable resistor R3 and the ground. It should be noted that each of the diode-connected npn transistors Q1 and Q2 may be replaced by a diode.

If currents flowing through the respective npn transistors Q1 and Q2 are represented by I1 and I2, and saturation currents of the respective npn transistors Q1 and Q2 are represented by IS1 and IS2, then base-emitter voltages Vbe1 and Vbe2 of the respective npn transistors Q1 and Q2 are represented by equations shown below.

$$Vbe1 = VT(T)*\ln(I1/IS1) \quad (1\text{-}1)$$

$$Vbe2 = VT(T)*\ln(I2/IS2) \quad (2\text{-}2)$$

It should be noted that, in the above equations, $VT(T) = kB*T/q$ wherein kB is Boltzmann constant, T is temperature, and q is elementary electric charge. If the size ratio between the npn transistors Q1 and Q2 is represented by n, the relationship between the saturation currents IS1 and IS2 of the respective npn transistors Q1 and Q2 is represented by an equation shown below.

$$IS2 = n*IS1 \quad (2)$$

When the differential amplifier 132 is in stable operation, the currents I1 and I2 flowing through the respective npn transistors Q1 and Q2 are, as shown below, represented by a linear function I(T) of a current I in relation to a temperature T.

$$I1 = I2 = I(T) \quad (3)$$

Accordingly, a difference ΔVbe between the base-emitter voltages Vbe1 and Vbe2 of the respective npn transistors Q1 and Q2 is represented as a voltage proportional to the temperature T as shown in an equation below.

$$\begin{aligned}\Delta Vbe &= Vbe1 - Vbe2 \\ &= VT(T)*\ln(I1/IS1) - VT(T)*\ln(I2/IS2) \\ &= VT(T)*\ln((I1/IS1)/(I2/IS2)) \\ &= VT(T)*\ln(n)\end{aligned} \quad (4)$$

The current I(T) flowing through each of the npn transistors Q1 and Q2 is represented by an equation shown below.

$$I(T) = VT(T)*\ln(n)/R3 \quad (5)$$

Here, if a voltage drop at both ends of the resistor R2 and a voltage drop at both ends of the variable resistor R3 are VR2 and VR3, respectively, then a reference voltage Vr1(T) outputted from the temperature characteristic adjustment function-equipped BGR 130 is represented by an equation shown below.

$$\begin{aligned}Vr1(T) &= VR3 + Vbe2 + VR2 \\ &= I(T)*(R3 + R2) + Vbe2 \\ &= (1 + R2/R3)*VT(T)*\ln(n) + Vbe2\end{aligned} \quad (6)$$

It should be noted that if the reference voltage Vr1(T) in the above equation is differentiated once by the temperature T, then an equation shown below holds true.

$$d\{Vr1(T)\}/dT = (1+R2/R3)*(kB/q)*\ln(n) \pm dVbe2/dT \quad (7)$$

It is known that, in general, the temperature characteristic of a base-emitter voltage Vbe of an npn transistor is represented by an equation shown below.

$$d(Vbe/dT) \approx -1.8 \text{ mV}/°\text{C.} \quad (8)$$

Figure 3:
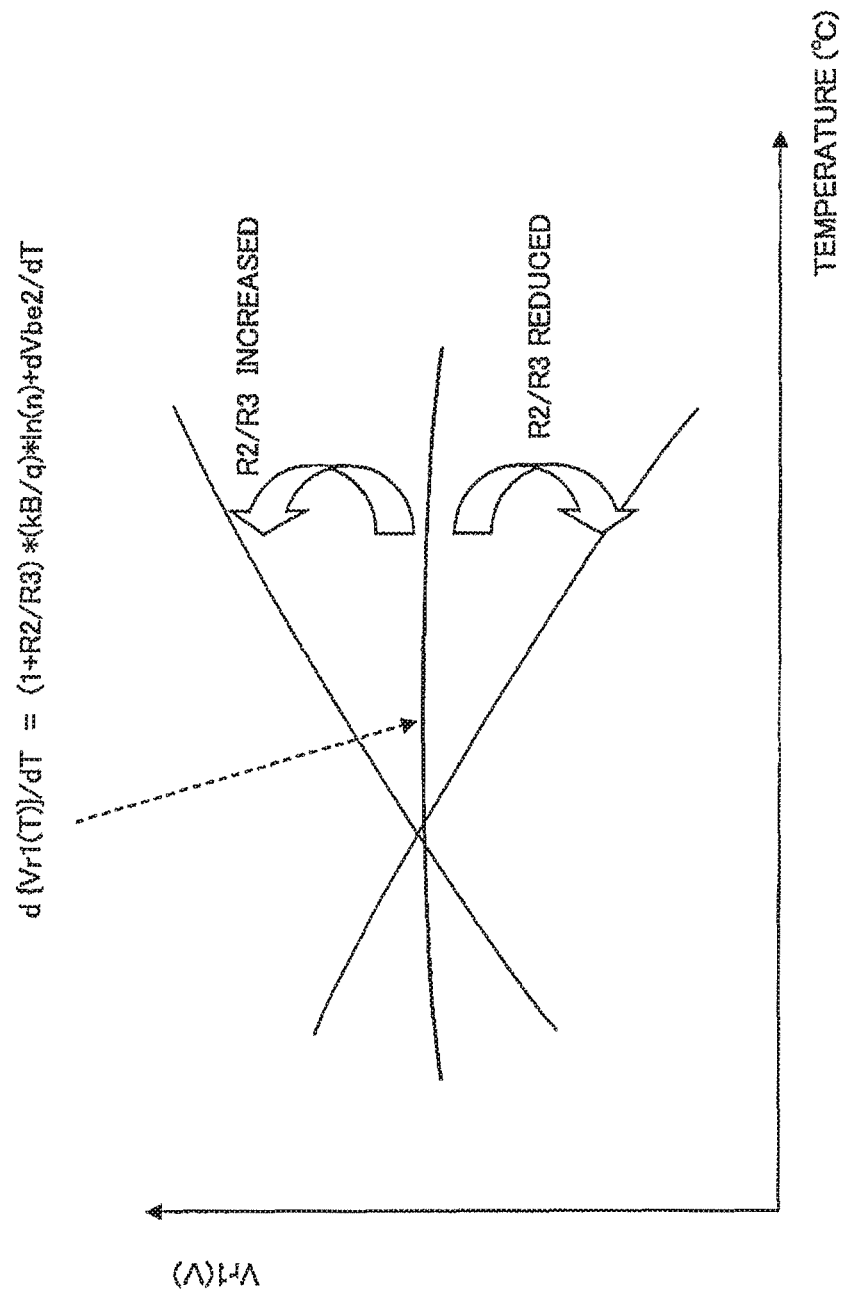
FIG. 3 illustrates temperature dependency of a reference voltage outputted from the temperature characteristic adjustment function-equipped BGR.

Based on the above relationships, the temperature gradient $(d\{Vr1(T)\}/dT)$ of the reference voltage Vr1 can be adjusted by adjusting the resistance ratio of the resistor R2 to the variable resistor R3 (R2/R3). FIG. 3 illustrates temperature dependency of the reference voltage Vr1(T) outputted from the temperature characteristic adjustment function-equipped BGR. It is understood from FIG. 3 that if the resistance ratio (R2/R3) is reduced, the term "dVbe2/dT" becomes dominant, and the reference voltage Vr1(T) becomes inclined to fall to the right in relation to the temperature T. On the other hand, if the resistance ratio (R2/R3) is increased, the term "(1+R2/R3)*(kB/q)*ln(n)" becomes dominant, and the reference voltage Vr1(T) becomes inclined to rise to the right in relation to the temperature T.

Thus, suitable adjustment of the resistance ratio (R2/R3) makes it possible to cause the reference voltage Vr1 to have such a temperature characteristic as to negate the total temperature characteristics of the amplifier 120, the analogue/digital converter 140, the temperature characteristic adjustment function-equipped BGR 130, and the like.

It should be noted that, in the configuration shown in FIG. 1, the value of the variable resistor R3 is set by retrieving the value from the ROM 135. However, as an alternative, the resistance value of the variable resistor R3 may be trimmed and thereby changed. That is, the ROM 135 is not essential.

Although the resistance ratio (R2/R3) is adjusted by varying the value of the variable resistor R3, the adjustment method is not limited to this. For example, as an alternative, the resistor R2 may be configured as a variable resistor, and the resistance ratio (R2/R3) may be adjusted by varying the value of the resistor R2.

[Analogue/Digital Converter]

Figure 4:
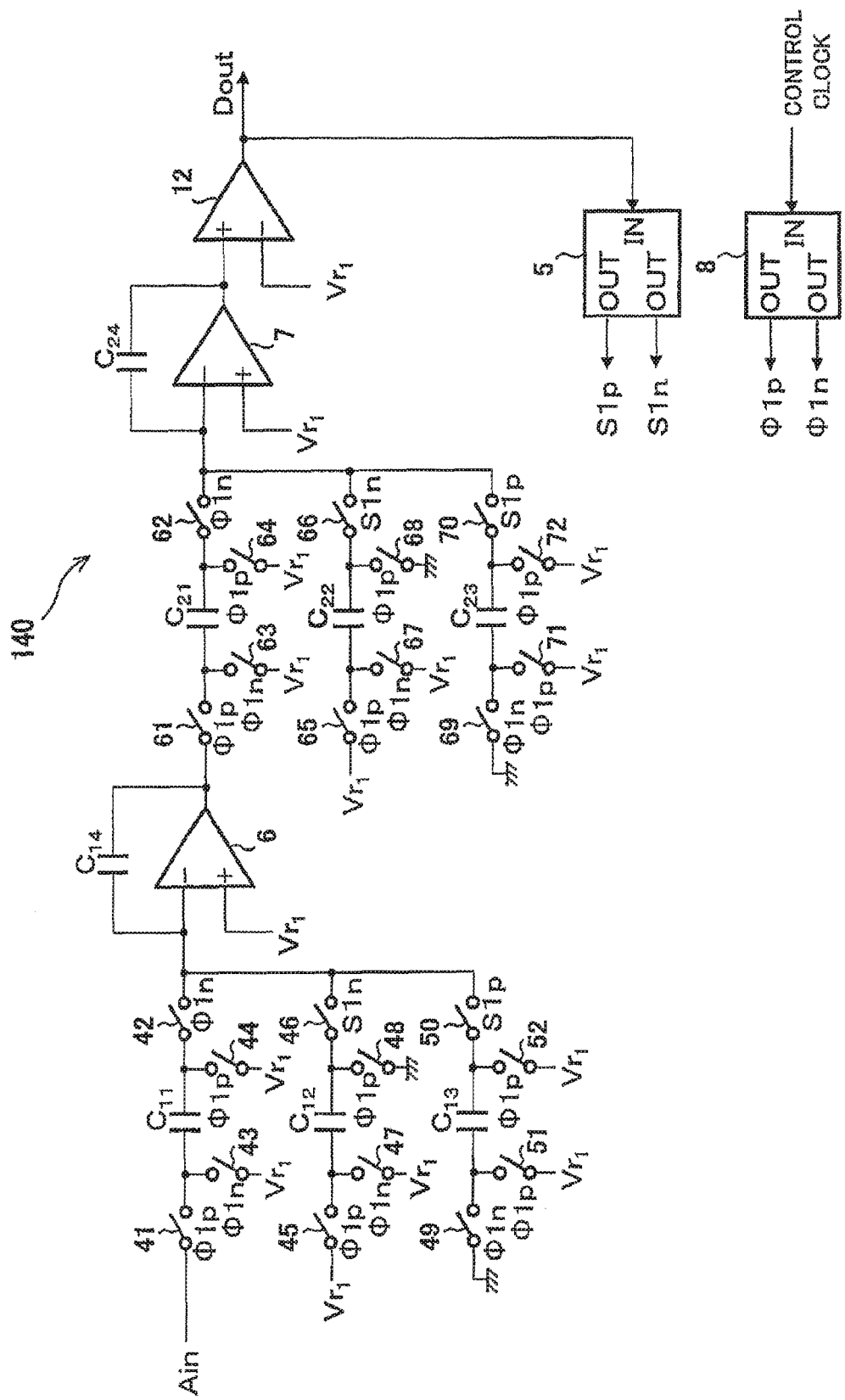
FIG. 4 is a circuit diagram showing an example of the configuration of an analogue/digital converter shown in FIG. 1.

FIG. 4 is a circuit diagram showing an example of the configuration of the analogue/digital converter 140 shown in FIG. 1.

The analogue/digital converter 140 shown in FIG. 4 is a so-called secondary delta-sigma analogue/digital converter, which includes: a differential amplifier 6 including a non-inverting input terminal to which the reference voltage Vr1 is applied, and including a negative feedback path to which an integration capacitor C14 is connected; a differential amplifier 7 including a non-inverting input terminal to which the reference voltage Vr1 is applied, and including a negative feedback path to which an integration capacitor C24 is connected; a switched capacitor circuit group provided at the inverting input terminal side of the differential amplifier 6; a switched capacitor circuit group provided at the inverting input terminal side of the differential amplifier 7; a comparator 12 including a non-inverting input terminal to which an output signal from the differential amplifier 7 is applied, and including an inverting input terminal to which the reference voltage Vr1 is applied; a switching control circuit 5 configured to perform switching control based on an output from the comparator 12; and a switching control circuit 8 configured to perform switching control based on a control clock.

Next, operations of the analogue/digital converter 140 shown in FIG. 4 are described. First, based on digital signals $\varphi 1p$ and $\varphi 1n$ outputted from the switching control circuit 8, a sampling process and a transfer process are repeated. The sampling process is a process of storing electric charge in a sampling capacitor C11, the electric charge corresponding to a differential voltage between an analogue input signal Ain (analogue measurement signal V2) and the reference voltage Vr1. The transfer process is a process of transferring the electric charge stored in the sampling capacitor C11 to the integration capacitor C14. As a result of repeating the sampling process and the transfer process, the analogue input signal Ain is integrated. Moreover, based on digital signals S1$p$ and S1$n$ outputted from the switching control circuit 5 in accordance with a 1-bit digital signal Dout, a sampling process and a transfer process are repeated. The sampling process is a process of storing electric charge in sampling capacitors C12 and C13, the electric charge corresponding to a differential voltage between the reference voltage Vr1 and the ground potential. The transfer process is a process of transferring the electric charge stored in the sampling capacitors C12 and C13 to the integration capacitor C14 and integrating the electric charge. As a result of repeating the sampling process and the transfer process, a feedback signal of the 1-bit digital signal Dout is subjected to digital/analogue conversion and integrated.

Furthermore, based on the digital signals $\varphi 1p$ and $\varphi 1n$ outputted from the switching control circuit 8, a sampling process and a transfer process are performed. The sampling process is a process of storing electric charge in a sampling capacitor C21, the electric charge corresponding to a differential voltage between an output signal from the differential amplifier 6 and the reference voltage Vr1. The transfer process is a process of transferring the electric charge stored in the sampling capacitor C21 to the integration capacitor C24. As a result of repeating the sampling process and the transfer process, an output signal from the differential amplifier 7 is integrated. Still further, based on the digital signals S1$p$ and S1$n$ outputted from the switching control circuit 5 in accordance with the 1-bit digital signal Dout, a sampling process and a transfer process are repeated. The sampling process is a process of storing electric charge in sampling capacitors C22 and C23, the electric charge corresponding to a differential voltage between the reference voltage Vr1 and the ground potential. The transfer process is a process of transferring the electric charge stored in the sampling capacitors C22 and C23 to the integration capacitor C24. As a result of repeating the sampling process and the transfer process, a feedback signal of the 1-bit digital signal Dout is subjected to digital/analogue conversion and integrated.

The output signal from the differential amplifier 7 is quantized by the comparator 12, and is outputted as the 1-bit digital signal Dout (digital measurement signal V3).

The switching control circuit 5 outputs the digital signals S1$p$ and S1$n$, which are in-phase and anti-phase with respect to the 1-bit digital signal Dout. ON and OFF of switches 46 and 66 are controlled by the digital signal S1$n$. ON and OFF of switches 50 and 70 are controlled by the digital signal S1$p$, such that the switches 50 and 70 are turned ON and OFF in a mutually compensating manner with the switches 46 and 66. The switching control circuit 8 outputs the digital signals $\varphi 1p$ and $\varphi 1n$, which are in-phase and anti-phase with respect to the control clock. ON and OFF of switches 41, 44, 45, 48, 51, 52, 61, 64, 65, 68, 71, and 72 are controlled by the digital signal $\varphi 1p$. ON and OFF of switches 42, 43, 47, 49, 62, 63, 67, and 69 are controlled by the digital signal $\varphi 1n$, such that the switches 42, 43, 47, 49, 62, 63, 67, and 69 are turned ON and OFF in a mutually compensating manner with the switches 41, 44, 45, 48, 51, 52, 61, 64, 65, 68, 71, and 72.

As described above, the analogue/digital converter 140 is configured to generate the 1-bit digital signal Dout (digital measurement signal V3) through a delta-sigma modulation process based on a differential voltage between the analogue input signal Ain (analogue measurement signal V2) and the reference voltage Vr1. Therefore, the temperature characteristic of the 1-bit digital signal Dout outputted from the analogue/digital converter 140 can be made constant by causing the reference voltage Vr1 to have such a temperature characteristic as to negate the total temperature characteristics of the amplifier 120, the analogue/digital converter 140, the temperature characteristic adjustment function-equipped BGR 130, and the like.

[Digital Processor]

Figure 5:
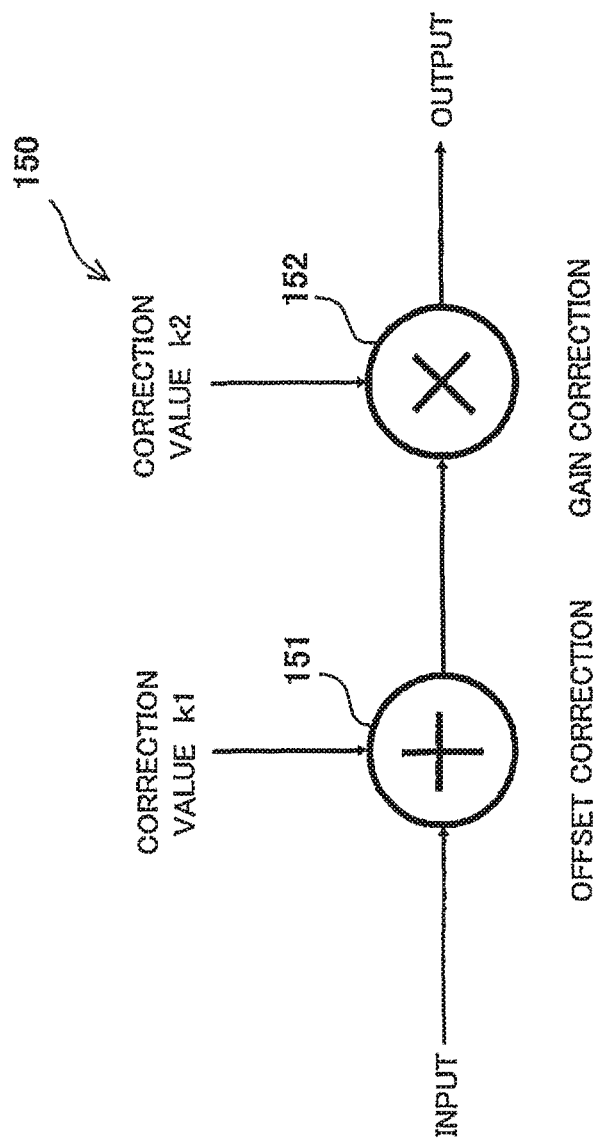
FIG. 5 is a functional block diagram illustrating digital correction performed by a digital processor shown in FIG. 1.
Figure 6:
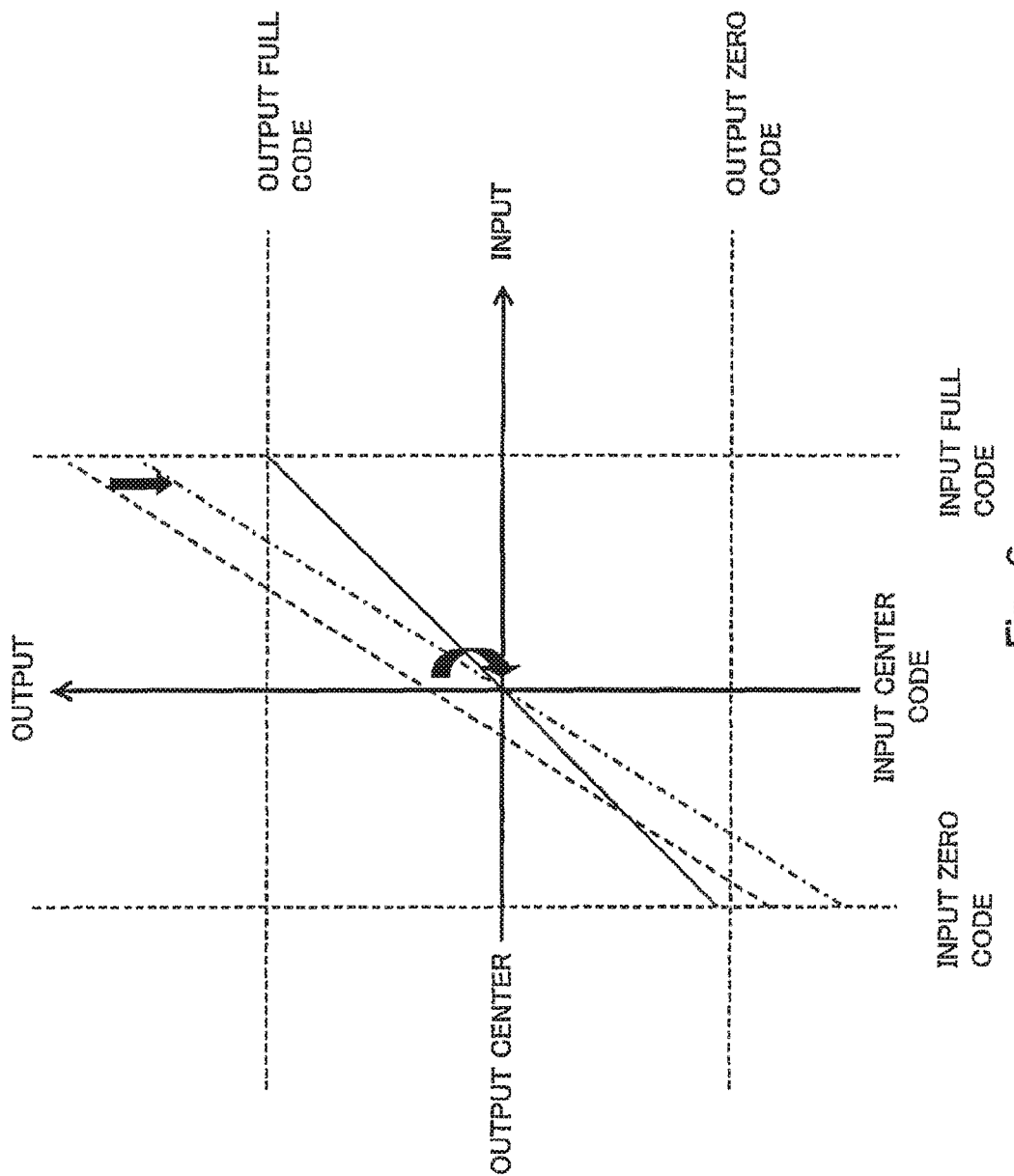
FIG. 6 is a conceptual diagram illustrating the digital correction performed by the digital processor shown in FIG. 5.

FIG. 5 is a functional block diagram illustrating digital correction performed by the digital processor 150. As shown in FIG. 5, the digital processor 150 includes: an adder 151 for use in offset correction, the adder 151 being configured to add the correction value k1 to an input signal; and a multiplier 152 for use in gain correction, the multiplier 152 being configured to multiply an output from the adder 151 by the correction value k2. FIG. 6 is a conceptual diagram illustrating the digital correction performed by the digital processor 150 shown in FIG. 5. As shown in FIG. 6, the correction value k1 is added to an input signal (i.e., offset correction), such that an output corresponding to the center code (median value) of the input signal becomes the output center. Thereafter, the input signal that has gone through the offset correction is multiplied by the correction value k2 (i.e., gain correction), such that an output corresponding to the full code (maximum value) of the input signal and an output corresponding to the zero code (minimum value) of the input signal become close to their ideal values. In this manner, digital correction is performed so as to remove influence of an offset error and gain error of the amplifier 120 and the analogue/digital converter 140 in addition to the correction of the temperature characteristic of the digital measurement signal V3 outputted from the analogue/digital converter 140.

Embodiment 2

Figure 7:
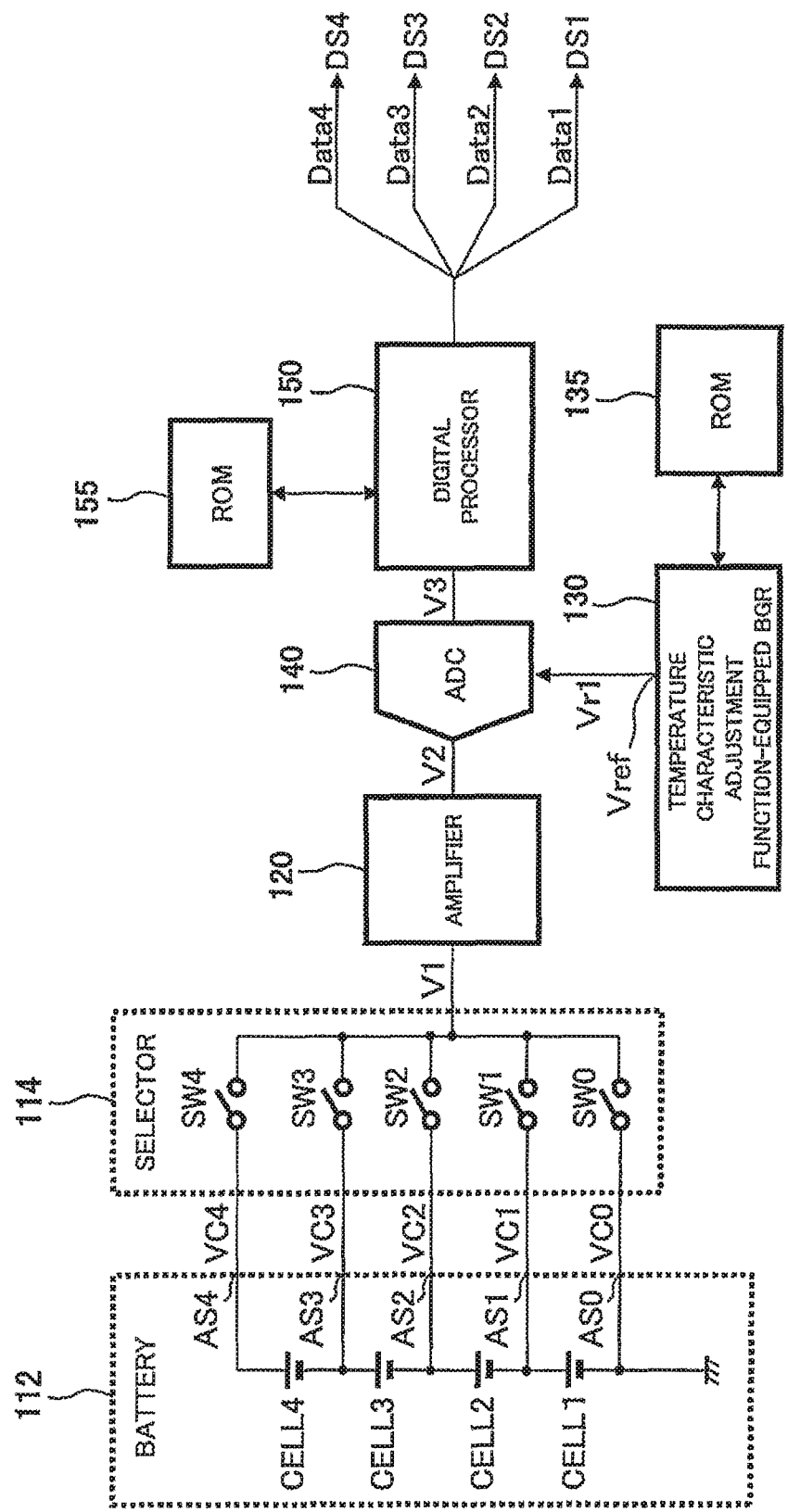
FIG. 7 shows an example of the configuration of a battery voltage detection system according to Embodiment 2 of the present invention.
Figure 8:
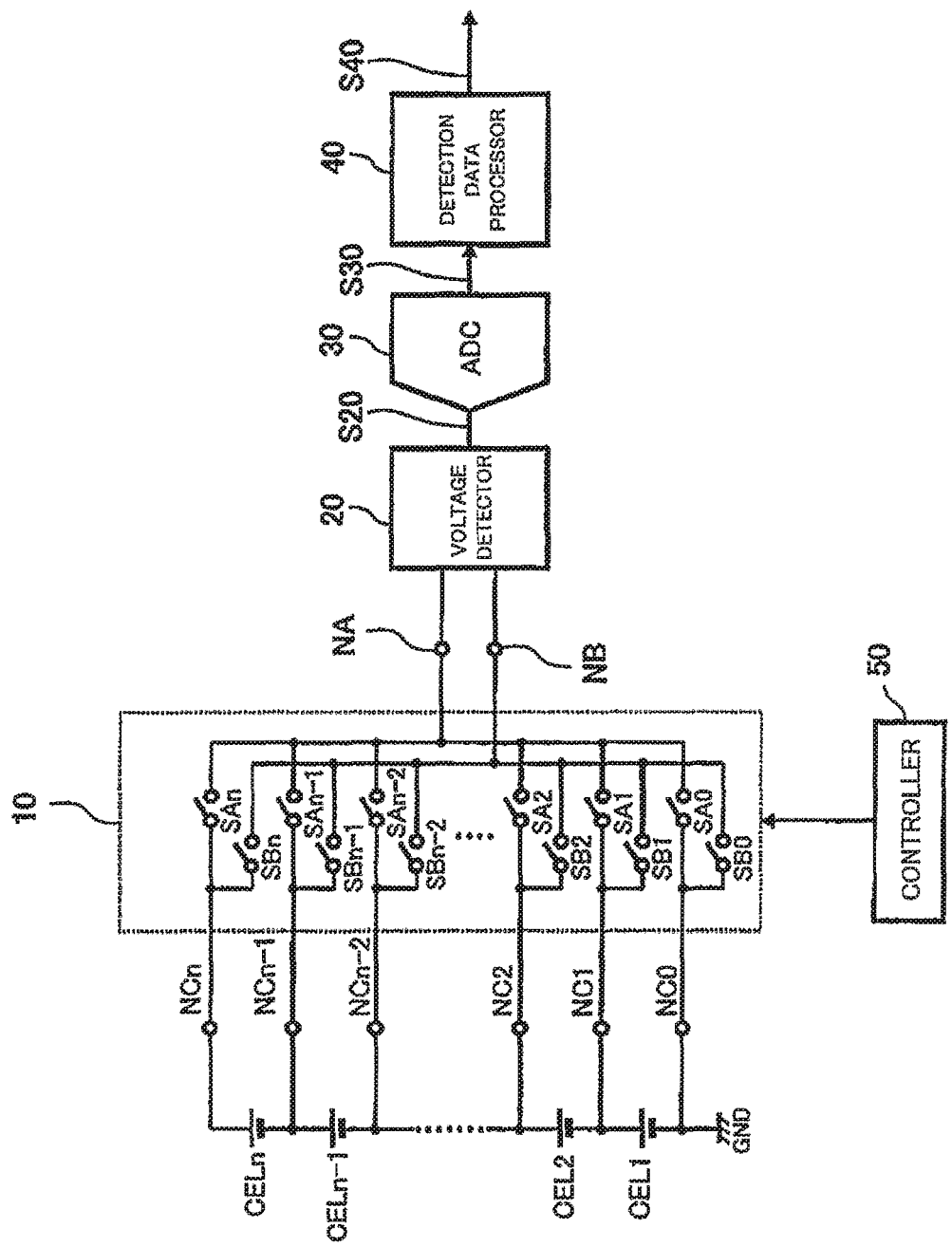
FIG. 8 shows a configuration of a conventional battery voltage detection system.

Hereinafter, Embodiment 2 of the present invention is described with reference to FIG. 7. FIG. 7 shows an example of the configuration of a battery voltage detection system according to Embodiment 2 of the present invention.

The battery voltage detection system shown in FIG. 7 is one mode of application of the analogue measurement data detection system shown in FIG. 1, in which the analogue measurement data detection system is applied to the detection of cell voltages of four respective battery cells 1 to 4 included in a battery 112. Specifically, the battery voltage detection system shown in FIG. 7 is a system configured to multiplex the cell voltages of the four respective battery cells 1 to 4 included in the battery 112, thereby converting the cell voltages into a continuous digital value, and to de-multiplex the continuous digital value into individual digital values corresponding to the respective cell voltages. Although the four battery cells 1 to 4 are connected in series in the battery 112 shown in FIG. 7, the configuration of the battery 112 is not limited to this. The cell voltages of the four respective battery cells 1 to 4 may be the same values or may be different values from one another.

The battery voltage detection system shown in FIG. 7 includes: a selector 114; the amplifier 120; the temperature characteristic adjustment function-equipped BGR 130; the ROM 135; the analogue/digital converter 140; the digital processor 150; and the ROM 155. Hereinafter, a description is given focusing on the selector 114 and the digital processor 150, which perform operations different from the operations performed in the configuration shown in FIG. 1.

The selector 114 is configured such that terminal voltages VC0 to VC4 of the four battery cells 1 to 4 are inputted to the selector 114. The selector 114 is configured to select one of the terminal voltages VC0 to VC4 based on a predetermined selector signal, and output the selected terminal voltage as the input voltage signal V1 for the amplifier 120. Specifically, the selector 114 includes switches SW0 to SW4. The terminal voltages VC0 to VC4 are inputted to one ends of the switches SW0 to SW4, respectively. The other ends of the switches SW0 to SW4 are connected to the same shared path.

The digital measurement signal V3 from the analogue/digital converter 140 is configured such that converted digital values of the respective terminal voltages VC0 to VC4 of the battery cells 1 to 4 are continuous with one another. The digital processor 150 is configured to de-multiplex the digital measurement signal V3 of the analogue/digital converter 140 into individual digital values Data1 to Data4 corresponding to the respective cell voltages of the four battery cells 1 to 4, and to output the digital values Data1 to Data4.

In the battery voltage detection system configured as described above, the digital measurement signal V3 outputted from the analogue/digital converter 140 can be made substantially constant regardless of the temperature by causing, with the temperature characteristic adjustment function-equipped BGR 130, the reference voltage Vr1 to have such a temperature characteristic as to negate the total temperature characteristics of the amplifier 120, the analogue/digital converter 140, the temperature characteristic adjustment function-equipped BGR 130, and the like.

From the foregoing description, numerous modifications and other embodiments of the present invention are obvious to one skilled in the art. Therefore, the foregoing description should be interpreted only as an example and is provided for the purpose of teaching the best mode for carrying out the present invention to one skilled in the art. The structural and/or functional details may be substantially altered without departing from the spirit of the present invention.

INDUSTRIAL APPLICABILITY

The present invention is useful for a battery voltage detection system configured to detect cell voltages of a plurality of respective battery cells connected in series in a battery, and particularly useful for an in-vehicle battery voltage detection system configured to detect cell voltages of a plurality of respective battery cells that are lithium ion batteries.

What is claimed is:

1. A battery voltage detection system comprising:
a plurality of battery cells included in a battery;
a selector, to which terminal voltages of the plurality of respective battery cells are inputted and which outputs an analogue signal;
a reference voltage generation circuit configured to generate and output a variable reference voltage; and
an analogue/digital converter configured to output a digital signal corresponding to the analogue signal, wherein
the reference voltage generation circuit includes:
a differential amplifier;
a first resistor connected between an output terminal and an inverting input terminal of the differential amplifier; and
a second resistor electrically connected to the inverting input terminal of the differential amplifier and one end of the first resistor, and
the reference voltage generation circuit outputs the variable reference voltage based on a resistance ratio between the first resistor and the second resistor.

2. The battery voltage detection system according to claim 1, wherein the variable reference voltage is a voltage signal whose characteristics gradient is variable.

3. The battery voltage detection system according to claim 1, wherein the variable reference voltage is a voltage signal whose characteristics gradient is variable.

4. The battery voltage detection system according to claim 1, further comprising a first memory electrically connected to the reference voltage generation circuit,
wherein the battery voltage detection system sets a value of the second resistor based on a correction value stored in the first memory.

5. The battery voltage detection system according to claim 4, wherein the battery voltage detection system sets the value of the second resistor by changing the second resistor.

6. The battery voltage detection system according to claim 1, wherein the reference voltage generation circuit further includes:
a third resistor connected between an output terminal and a non-inverting input terminal of the differential amplifier; and
a first diode circuit element connected between a ground, and the non-inverting input terminal of the differential amplifier and one end of the third resistor.

7. The battery voltage detection system according to claim 1, wherein the selector multiplexes the terminal voltages, and outputs a resultant signal as the analogue signal.

8. The battery voltage detection system according to claim 1, wherein the digital signal is a signal whose characteristics variation has been negated.

9. The battery voltage detection system according to claim 1, further comprising a digital processor configured to convert the digital signal into digital values corresponding to cell voltages of the plurality of respective battery cells.

10. The battery voltage detection system according to claim 9, further comprising a system controller, to which the digital value is inputted,
wherein the system controller controls charging and discharging of the battery based on the digital value.

11. The battery voltage detection system according to claim 9, wherein the digital processor includes an adder performing offset correction and a multiplier performing gain correction.

12. The battery voltage detection system according to claim 11, further comprising a second memory electrically connected to the digital processor, wherein the offset correction and the gain correction are performed by using a correction value stored in the second memory.

13. The battery voltage detection system according to claim 9, further comprising a second memory electrically connected to the digital processor,
wherein the battery voltage detection system outputs the digital value by using a correction value stored in the second memory.

14. The battery voltage detection system according to claim 1, wherein the analogue/digital converter is a delta-sigma analogue/digital converter.

15. The battery voltage detection system according to claim 1, wherein the analogue/digital converter is a successive approximation register analogue/digital converter.

16. The battery voltage detection system according to claim 1, further comprising an amplifier configured to amplify an output from the selector, and output a resultant signal as an analogue measurement signal.

17. The battery voltage detection system according to claim 1, further comprising the battery, which is a battery module in which the plurality of battery cells are connected in series.

* * * * *